United States Patent
Ulrich

(10) Patent No.: US 9,862,053 B2
(45) Date of Patent: Jan. 9, 2018

(54) SYSTEMS AND METHODS FOR DETECTING NON-OPERATING THYRISTORS IN WELDING SYSTEMS

(71) Applicant: ILLINOIS TOOL WORKS INC., Glenview, IL (US)

(72) Inventor: James F. Ulrich, Appleton, WI (US)

(73) Assignee: Illinois Tool Works Inc., Glenview, IL (US)

( * ) Notice: Subject to any disclaimer, the term of this patent is extended or adjusted under 35 U.S.C. 154(b) by 458 days.

(21) Appl. No.: 14/565,994

(22) Filed: Dec. 10, 2014

(65) Prior Publication Data

US 2016/0167152 A1    Jun. 16, 2016

(51) Int. Cl.

| | |
|---|---|
| B23K 9/10 | (2006.01) |
| G01R 31/02 | (2006.01) |
| B23K 9/095 | (2006.01) |
| G01R 31/26 | (2014.01) |
| H02M 1/088 | (2006.01) |

(Continued)

(52) U.S. Cl.
CPC .......... *B23K 9/1043* (2013.01); *B23K 9/0953* (2013.01); *B23K 9/0956* (2013.01); *B23K 9/1006* (2013.01); *B23K 9/1062* (2013.01); *B23K 9/173* (2013.01); *G01R 31/024* (2013.01); *G01R 31/263* (2013.01); *H02H 7/1255* (2013.01); *H02M 1/088* (2013.01); *H02M 7/162* (2013.01)

(58) Field of Classification Search
CPC .. B23K 9/1043; B23K 9/0953; B23K 9/0956; B23K 9/1006; B23K 9/1062; B23K 9/173; G01R 31/024; G01R 31/263; H02H 7/1255; H02M 1/088; H02M 7/162
See application file for complete search history.

(56) References Cited

U.S. PATENT DOCUMENTS

| | | |
|---|---|---|
| 4,314,195 A | 2/1982 | Muter |
| 5,406,051 A | 4/1995 | Lai |

(Continued)

FOREIGN PATENT DOCUMENTS

| | | |
|---|---|---|
| CN | 201632743 | 11/2010 |
| CN | 103973123 | 8/2014 |
| SU | 1355401 | 11/1987 |

OTHER PUBLICATIONS

International Search Report from PCT application No. PCT/US2015/056023, dated Feb. 11, 2016, 15 pgs.

(Continued)

*Primary Examiner* — Brian Jennison
(74) *Attorney, Agent, or Firm* — McAndrews, Held & Malloy, Ltd.

(57) ABSTRACT

A welding system includes a power supply coupled to a power source and configured to receive a power signal. The power supply includes power conversion circuitry having one or more silicon-controlled rectifiers (SCRs) and configured to rectify the power signal to generate a DC signal for use in providing welding power. The welding system also includes an SCR detection system configured to receive a signal indicative of an inductor current of the DC signal and a signal indicative of a voltage of the DC signal. The SCR detection system is further configured detect a non-firing, open, or shorted SCR in the one or more SCRs based on the inductor current and the welding voltage of the DC signal.

20 Claims, 7 Drawing Sheets

(51) Int. Cl.
*H02H 7/125* (2006.01)
*B23K 9/173* (2006.01)
*H02M 7/162* (2006.01)

(56) References Cited

U.S. PATENT DOCUMENTS

| | | | |
|---|---|---|---|
| 5,408,067 A | 4/1995 | Crouse | |
| 6,567,253 B1 | 5/2003 | Herwig | |
| 6,963,216 B2 | 11/2005 | Smith | |
| 2004/0251910 A1* | 12/2004 | Smith | G01R 31/14 |
| | | | 324/510 |
| 2010/0308027 A1* | 12/2010 | Vogel | B23K 9/0953 |
| | | | 219/130.21 |
| 2011/0011842 A1 | 1/2011 | Thomas | |

OTHER PUBLICATIONS

Narula, Swati et al.; "Isolated Bridgeless Converter for Welding Power Supply with Improved Power Quality," 2014 IEEE Students Conference on Electrical, Electronics and Computer Science, Mar. 1, 2014, pp. 1-6.

Thamodharan, M. et al; "Steady and Pulsed Direct Current Welding with a Single Converter," Welding Journal, American Welding Society, vol. 78, No. 3, Mar. 1, 1999, pp. 75-S.

* cited by examiner

SYSTEMS AND METHODS FOR DETECTING NON-OPERATING THYRISTORS IN WELDING SYSTEMS

BACKGROUND

The invention relates generally to welding systems. Specifically, the embodiments described herein relate to detecting non-operating silicon-controlled rectifiers (SCRs) in power supplies for welding systems.

Many types of welding operations require significant amounts of power. Welding systems may use a high current or high voltage input signal to generate large welding currents and voltages suitable for the welding operation. In particular, welding systems may use isolated alternating current (AC) input signal, and may convert the input signals into direct current (DC) signals suitable for operation.

To perform this power conversion, power conversion circuitry for the welding system may include one or more SCRs. However, if at least one of the SCRs becomes non-operating (i.e., non-firing, open circuit, or shorted), then the welding system should be removed from operation.

As such, the welding system often includes circuitry or control logic that detects shorted SCRs. For instance, the welding system may include control logic that test the circuitry containing the SCRs using a variety of test signals, and may compare the outputted signals to target signals. This process may be performed periodically or based on an event, such as start-up of the welding system. However, it would be beneficial to improve the process for detecting shorted SCRs. Further, it would be desirable to detect any type of non-operating SCRs (i.e., non-firing, open, and shorted SCRs).

BRIEF DESCRIPTION

In one embodiment, a welding system includes a power supply coupled to a power source and configured to receive a power signal. The power supply includes power conversion circuitry having one or more silicon-controlled rectifiers (SCRs) and configured to rectify the power signal to generate a DC signal for use in providing welding power. The welding system also includes an SCR detection system configured to receive a signal indicative of an inductor current of the DC signal and a signal indicative of a voltage of the DC signal. The SCR detection system is further configured to detect a non-firing, open, or shorted SCR in the one or more SCRs based on the inductor current and the welding voltage of the DC signal.

In another embodiment a method includes, in a welding system having a power supply coupled to a power source and configured to receive a power signal, the power supply having power conversion circuitry having one or more silicon-controlled rectifiers (SCRs) and configured to rectify the power signal to generate a DC signal for use in providing welding power, receiving a signal indicative of a frequency of an AC signal provided by the power source. The method also includes receiving a signal indicative of an inductor current of a DC signal generated by rectifying the AC signal via the power conversion circuitry, receiving a signal indicative of a voltage of the DC signal, and determining a ripple component of the inductor current and the welding voltage. Further, the method includes detecting a non-firing, open, or shorted SCR in the at least one SCR if the line frequency ripple component is significant for a pre-set number of cycles of the AC signal.

In another embodiment, a retrofit kit for a welding system includes electronic memory storing executable code and a digital signal processor operatively coupled to the memory. The digital signal processor is configured to execute the stored code to receive a signal indicative of an AC power signal for the welding system, a signal indicative of an inductor current of a DC signal generated by rectifying the AC power signal, and a signal indicative of a welding voltage of the DC signal. The digital signal processor is also configured to determine a ripple component of the inductor current and the welding voltage and detect a non-firing, open, or shorted SCR in the one or more SCRs if the line frequency ripple component is significant.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
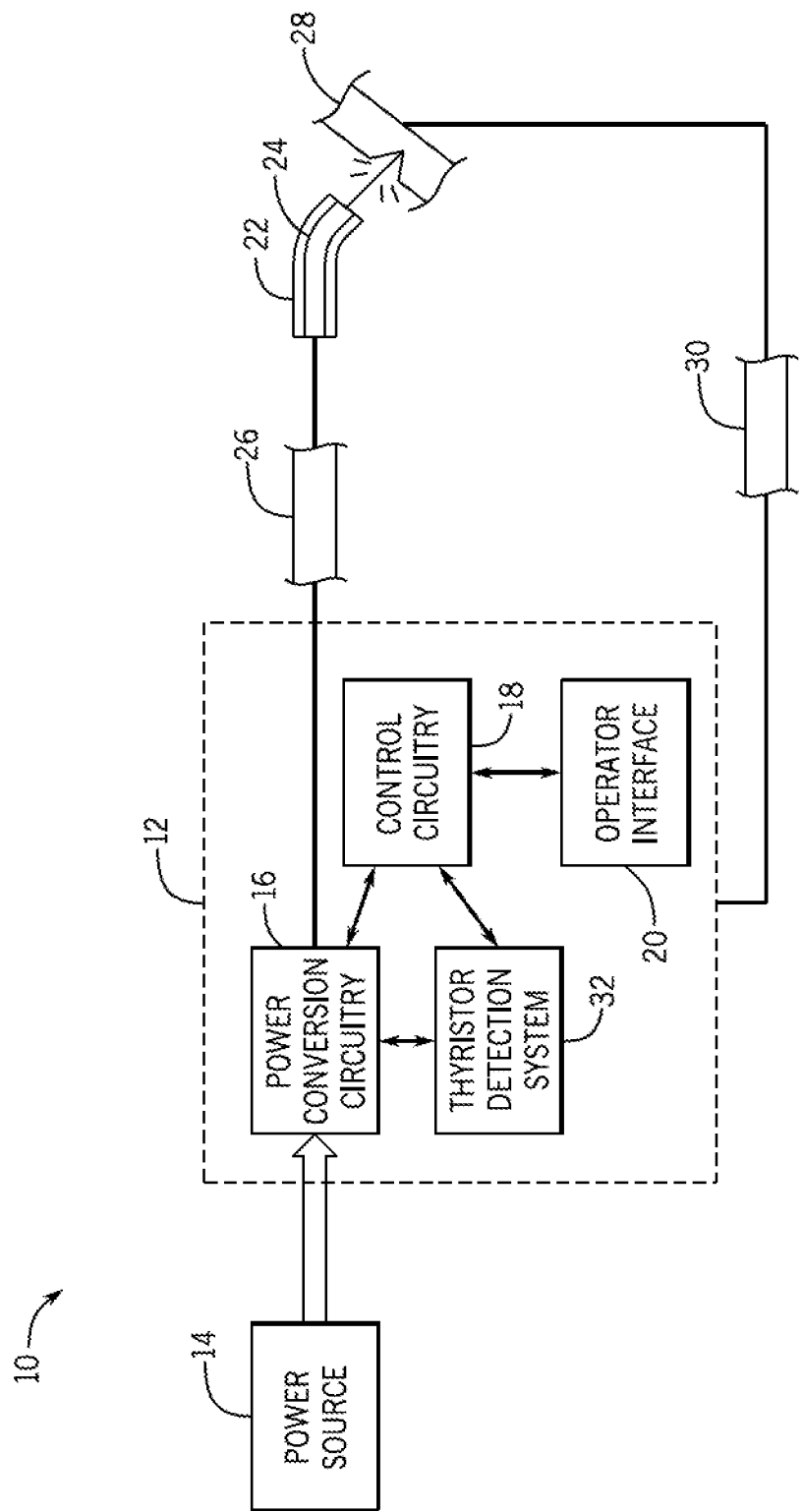
FIG. 1 is a schematic drawing of a welding system having a thyristor detection system, in accordance with an embodiment of the present approach.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. The phrase "non-operating silicon-controlled rectifier (SCR)" is intended to refer to any SCR that is non-firing, open, or shorted.

Many types of welding systems including power conversion circuitry such that the welding system may receive an alternating current (AC) input signal from a power source and convert it into the direct current (DC) output signal used for various types of welding operations. Specifically, the power conversion circuitry may include one or more thyristors, such as silicon-controlled rectifiers (SCRs), gate turn-off thyristors (GTOs), MOSFET controlled thyristors, and the like, to convert high voltage or high current AC signals to DC signals.

When a thyristor in the power conversion circuitry becomes non-operating (i.e., the thyristors is non-firing, open, or shorted), the power conversion circuitry can no longer rectify the incoming AC signals to produce the desired DC signals. That is, while the rectifier 34 may still convert an AC signal to a DC signal, it may not produce the desired DC signal. Accordingly, an operator must remove the welding system from operation to schedule or perform maintenance.

To detect non-operating thyristors, present embodiments of welding systems may include a thyristor detection system. The thyristor detection system may use the inductor current and the welding voltage of the DC signal to determine whether a thyristor is non-operating. Specifically, the thyristor detection system may determine whether a thyristor is non-operating based on a comparison of the frequency of the ripple component of the inductor current and welding voltage signals and the frequency of the AC input signal. Once the thyristor detection system determines that a thyristor is non-operating, the thyristor detection system or the welding system may initiate shut down of the welding system.

As will be described in further detail below, the difference in the frequency of the ripple component during normal operation as opposed to a non-operating thyristor is quite large, which may reduce the amount of false positives and negatives for the thyristor detection system. Additionally, the signal-to-noise ratio of the inductor current and welding voltage signals is typically high, which increases the accuracy of the measurements used by the thyristor detection system and, in turn, the accuracy of the thyristor detection system itself. Further, as will be shown below, the thyristor detection system may detect a non-operating thyristor in as little as 50 ms, thereby reducing the time in which the welding system is running with a non-operating thyristor. Additionally, in certain embodiments, the thyristor detection system may use a method to determine the frequency of the ripple component that decreases the number of computations and simplifies the type of calculations performed, as will be described in further detail below. This, in turn, may increase reduce the computation time, power requirements, and resource consumption of the thyristor detection system. Moreover, by utilizing the frequency of the ripple component of the inductor current and welding voltage signals, the present thyristor detection system may be used to detect non-operating thyristors in power conversion circuitry for both single- and three-phase power sources. Further, if the welding system has one or more non-operating thyristors, one or both of the ripple signals will have a significant line frequency component. As such, the thyristor detection system may detect a non-operating thyristor in systems that use any number of thyristors for power conversion circuitry.

The present thyristor detection system may not require additional hardware or software modifications to the welding system, as many welding systems measure the inductor current and welding voltage signals for other control purposes. The thyristor detection system may be implemented in both circuitry and digital control logic. In embodiments where the thyristor detection system is implemented as digital control logic, the thyristor detection system may be ported to a device capable of digital signal processing, such as a microcontroller or field programmable gate array (FPGA), and packaged as a retrofit kit for existing welding systems.

With the foregoing in mind, FIG. 1 depicts a welding system 10 that may utilize an embodiment of the thyristor detection system described above. The welding system 10 includes a power supply 12 which is coupled to a power source 14. The power source 14 may be a single-phase power source, a three-phase power source, or a power source capable of providing both single- and three-phase power signals. The power source provides a high-voltage AC signal that is received by the power supply 12 and conditioned for use in a welding operation, as described in further detail below.

The power supply 12 includes power conversion circuitry 16, control circuitry 18, and an operator interface 20. The power conversion circuitry 16 conditions the AC power signal for use in a welding operation. The control circuitry 18 may generally monitor and control the operation of the welding system 10. For instance, the control circuitry 18 may monitor the current and voltage of a generated welding arc to determine whether the generated welding arc is sufficient for the desired welding operation. The operator interface 20 may enable an operator to perform certain functions on or using the welding system 10. For example, the welding system 10 may be configured to perform different types of welding operations, and an operator may utilize the operator interface 20 to select the appropriate welding operation.

The welding system 10 also includes a welding torch 22 that has an electrode 24. The welding torch 22 receives the conditioned power signal from the power supply 12 via a work cable 26. The conditioned power signal creates an electric arc between the electrode 24 and a metal workpiece 28, which the operator uses to make the desired welds. A return cable 30 couples the workpiece 28 to the power supply 12, thereby completing the "circuit" created by the welding operation. The welding system 10 may be used for any type of welding operation, such as gas metal arc welding, gas tungsten arc welding, shielded metal arc welding, and spot welding. Additionally, as noted above, the welding system 10 may be configured to perform several types of welding operations. Further, it should be appreciated that the welding system 10 may also be a system used for gouging and cutting operations, such as carbon arc gouging and plasma cutting.

As mentioned above, the power supply 12 includes power conversion circuitry 16 that conditions the high-voltage AC signal from the power source 14. In particular, the power conversion circuitry 16 rectifies the high-voltage AC signal to generate a high-voltage DC signal that is suitable for the welding operation. To perform this conversion, the power conversion circuitry 16 includes one or more thyristors. For example, the thyristors may be silicon-controlled rectifiers (SCRs), which are commonly used in rectifier circuitry for devices that control high power or high voltage signals. To detect non-operating thyristors, the power supply 12 may also include a thyristor detection system 32 coupled to the power conversion circuitry 16 and the control circuitry 18, and which is described in further detail below.

Figure 2:
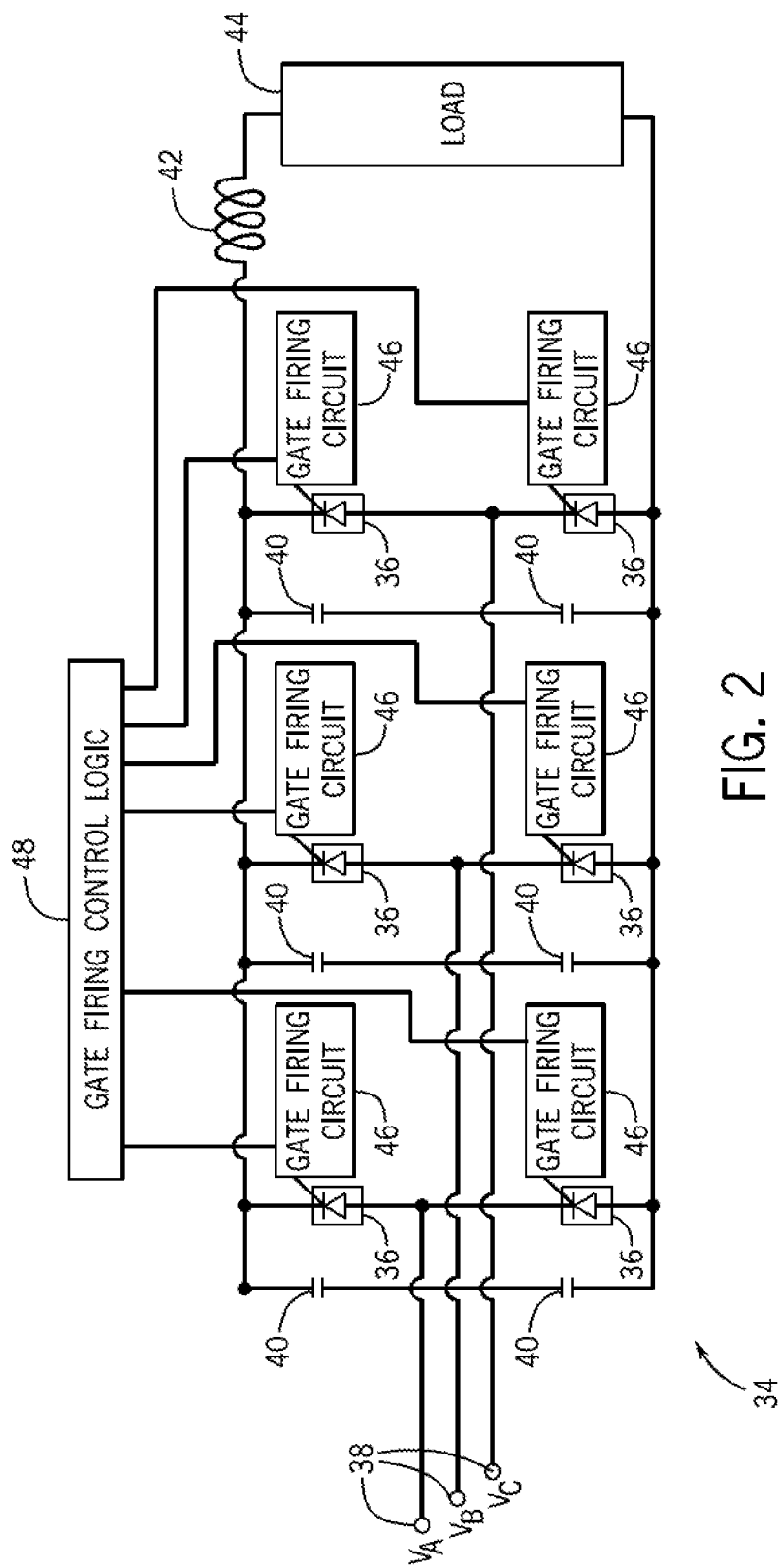
FIG. 2 is a schematic of a rectifier circuit within a power supply of the welding system of FIG. 1, in accordance with an embodiment of the present approach.

Turning now to FIG. 2, the power conversion circuitry 16 includes a rectifier 34 to convert the high-voltage AC signal to a high voltage DC signal. The rectifier 34 includes one or more SCRs 36, as described above. For instance, in FIG. 2, the rectifier 34 is a three-phase rectifier and as such includes six SCRs 36, which form a full-wave, three-phase bridge. As shown in FIG. 2, a pair of SCRs 36 are connected in series, and each of the three pairs are connected in parallel. Each pair of SCRs 36 is connected to a voltage input 38, one for each phase of the high-voltage AC signal. That is, the phase of the high-voltage AC signal will be different at each of the voltage inputs 38. In addition to the SCRs 36, the rectifier 34 may also include other components such as capacitors 40 and an inductor 42 coupled in series and/or parallel to the SCRs 36. The SCRs 36, the capacitors 40, and the inductor 42 are in turn coupled to a load 44, which in present embodiments may be the work cable 26 or another portion of the power conversion circuitry 16. As will be appreciated, the number and configuration of the SCRs 36, the capacitors 40, the inductor 42, and any other components may be determined according to the desired type of rectifier 34. Further, although the present embodiment is depicted as a full-wave, three-phase rectifier containing full, wave, three-phase SCRs, it should be appreciated that the rectifier 34 may be a half-wave and/or single-phase rectifier circuit, and the SCRs 36 may form half-wave and/or single-phase rectifiers. It should also be noted that the present techniques may be used for half-controlled rectifiers as well.

Each SCR 36 is coupled to a gate firing circuit 46, which may be any suitable gate trigger circuit that can switch the respective SCR 36 from a non-conducting state to a conducting state (also known as "firing") and vice versa. In other embodiments, other types of trigger circuits, such as forward voltage trigger circuits, temperature trigger circuits, light trigger circuits, and the like, may be used to switch the operating states of the SCRs 36. The gate firing circuits 46 may be implemented using analog circuitry or digital logic. Gate firing control logic 48 may control the gate firing circuits 46 to toggle the SCRs 36 between conducting and non-conducting states as desired. For example, in the depicted embodiment, the SCRs 36 and the capacitors 40 are arranged such that the gate firing control logic 48 may use the gate firing circuits 46 to switch the SCRs 36 as desired using forced commutation. The gate firing control logic 48 may be implemented separately from the control circuitry 18 and may be communicate with the control circuitry 18, or the gate firing control logic 48 may be part of the control circuitry 18.

Once an SCR 36 becomes non-operating, the rectifier 34 may no longer perform the conversion from an AC signal to a DC signal. That is, while the rectifier 34 may still convert an AC signal to a DC signal, it may not produce the desired DC signal. Because the power conversion circuitry 16 can no longer supply the conditioned power signal, the welding operation may not operate optimally. Further, because the welding system 10 may typically employ high voltage AC power sources, the un-rectified AC signal may also cause damage to other components of the power conversion circuitry 16 and the welding system 10 downstream of the rectifier 34.

To detect non-operating SCRs 36, the welding system 10 includes the thyristor detection system 32, as mentioned above. The thyristor detection system 32 may generally determine when at least one SCR 36 in the rectifier 34 becomes non-operating based on the inductor current and the welding voltage of the generated DC signal. Once the thyristor detection system 32 determines that an SCR 36 is non-operating, the thyristor detection system 32 may initiate control actions to shut down the welding system 10.

Figure 3:
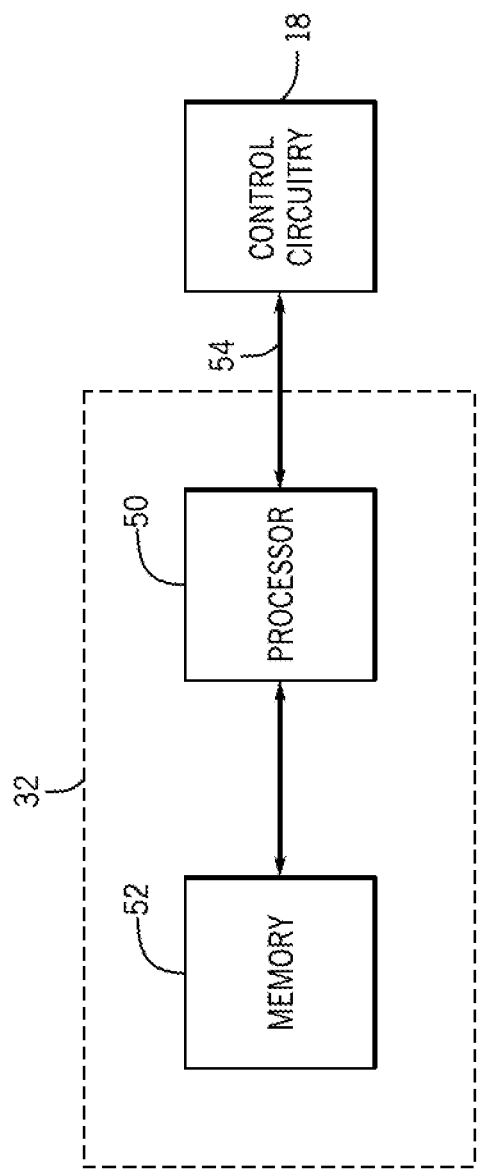
FIG. 3 is a block diagram of the thyristor detection system of FIG. 1, in accordance with an embodiment of the present approach.

Turning now to FIG. 3, the thyristor detection system 32 may be implemented as digital control logic. The thyristor detection system 32 includes a processor 50, memory 52, and a communicative link 54. The processor 50 may be, for example, a general-purpose single- or multi-chip or core processor suitable for performing computing and processing tasks. Additionally, the processor may be any conventional special-purpose processor, such as a digital signal processor. As shown, the processor 50 and/or other data processing circuitry may be operably coupled to memory 52 to retrieve and execute instructions for the thyristor detection system 23. For example, these instructions may be encoded in programs that are stored in memory 52, which may be an example of a tangible, non-transitory computer-readable medium, and may be accessed and executed by the processor 50 to allow for the presently disclosed techniques to be performed. The memory 52 may be a mass storage device, a FLASH memory device, removable memory, or any other non-transitory computer-readable medium. Additionally and/or alternatively, the instructions may be stored in an additional suitable article of manufacture that includes at least one tangible, non-transitory computer-readable medium that at least collectively stores these instructions or routines in a manner similar to the memory 52 as described above. The communicative link 54 may be any wired (e.g., a wired telecommunication infrastructure or local area network employing Ethernet) or wireless (e.g., a cellular network or an 802.11x Wi-Fi network) connection that allows the thyristor detection system 32 to communicate with other components, such as the control circuitry 18 or the operator interface 20.

The thyristor detection system 32 may be implemented any suitable device capable of performing digital signal processing, such as a microcontroller or FPGA, which may then be installed within the power supply 12. Indeed, in some embodiments, the thyristor detection system may be packaged as a retrofit kit or module for existing welding systems 10. Alternately, the thyristor detection system 32 may be a component of the control circuitry 18. In other embodiments, the thyristor detection system 32 may be analog circuitry within the power supply 12.

As mentioned above, the thyristor detection system 32 uses signals that are normally used for other purposes by the welding system 10. In particular, the thyristor detection system 32 uses measurements of the inductor current and the welding voltage of the generated DC signal, which may be provided by the control circuitry 18 or by sensors within the welding system 10.

During standard operation of the welding system 10, the inductor current and welding voltage signals consist of DC signals with a ripple component. The frequency of the ripple is six times the frequency of the AC signal from the power source 14 (e.g., if the AC signal from the power source operates at 50 Hz, the ripple component frequency is 300 Hz). When an SCR 36 becomes non-operating, the line frequency ripple component becomes significant, which may be at least five percent of the output value of the inductor current or the welding voltage. This change in value occurs after exactly one SCR 36 becomes non-operating.

To detect a non-operating SCR 36, the thyristor detection system 32 capitalizes on the difference in the line frequency ripple component during standard operation versus during an SCR malfunction. That is, the thyristor detection system 32 determines the line frequency ripple component, and evaluates whether the line frequency ripple component is significant. The line frequency ripple component is negligible (i.e., approximately zero) during standard operation, but significant during an SCR malfunction.

To determine the line frequency ripple component, the thyristor detection system 32 calculates the discrete Fourier transform (DFT) of the inductor current and welding voltage signals. The thyristor detection system 32 calculates the DFT of both the inductor current and the welding voltage signals because the line frequency component of voltage will be zero with a shorted output, while the line frequency component of current will be zero if the output is open, regardless of whether the SCR is open or short. The other signal (current into a shorted output, voltage into an open circuit output) will be significant if an SCR is either shorted or opened. As such, evaluating the ripple component of both the inductor current and welding voltage signals allows the thyristor detection system 32 to detect both shorted and open SCRs 36, in addition to non-firing SCRs 36 (i.e., any non-operating SCR 36). As will be appreciated, other Fourier transforms (or frequency-evaluation techniques) may be used instead of the DFT described (e.g., a continuous Fourier transform if the thyristor detection system 32 consists of analog circuitry).

In a presently contemplated embodiment, the thyristor detection system 32 may use the following equation (1) to calculate the complex DFT of the inductor current and welding voltage signals:

$$|X[k]| = \sqrt{\text{Re}(X[k])^2 + \text{Im}(X[k])^2} \tag{1}$$

wherein X[k] represents the complex frequency coefficient, k represents the index of the frequency coefficient (i.e., first, second, third, and so on), Re(X[k]) represents the real component of the complex frequency coefficient, and Im(X[k]) represents the imaginary component of the complex frequency coefficient. The ripple component is equivalent to the magnitude of the complex frequency coefficient, which is the value of Re(X[k]) when Im(X[k]) equals zero. Re(X[k]) and Im(X[k]) can be found using the following equations (2) and (3):

$$\text{Re}(X[k]) = X[k]_{cos} = \frac{1}{N}\sum_{n=1}^{N} x_n \cos\left(\frac{2\pi k n}{N}\right) \tag{2}$$

$$\text{Im}(X[k]) = X[k]_{sin} = \frac{1}{N}\sum_{n=1}^{N} x_n \sin\left(\frac{2\pi k n}{N}\right) \tag{3}$$

wherein N represents the number of samples of the signal, n represents the index of the current sample, and $x_n$ represents the value of the current sample.

To simplify the calculations, the thyristor detection system 32 may be configured to only determine the ripple component (i.e., when k=1). Further, the thyristor detection system 32 may also calculate Re(X[k]) and Im(X[k]) recursively, using the following equations (4) and (5):

$$\text{Re}(x[1]_n) = \cos\left(\frac{2\pi}{N}\right)\text{Re}(X[1]_{n-1}) - \sin\left(\frac{2\pi}{N}\right)\text{Im}(X[1]_{n-1}) \tag{4}$$

$$\text{Im}(X[1]_n) = \sin\left(\frac{2\pi}{N}\right)\text{Re}(X[1]_{n-1}) + \cos\left(\frac{2\pi}{N}\right)\text{Im}(X[1]_{n-1}) \tag{5}$$

The thyristor detection system 32 may specifically use a 201 point DFT. That is, the thyristor detection system 32 may use the following equation (6):

$$N \approx 64\pi \tag{6}$$

By using a 201-point DFT, other portions of equations 4 and 5 may be simplified to equations (7), (8), and (9), as shown below:

$$\frac{2\pi}{N} = \frac{1}{32} \tag{7}$$

$$\sin\left(\frac{2\pi}{N}\right) \approx \frac{1}{32} \tag{8}$$

$$\cos\left(\frac{2\pi}{N}\right) \approx 1 - \frac{1}{2}\sin^2\left(\frac{2\pi}{N}\right) \approx 1 - \frac{1}{2^{11}} \tag{9}$$

Using the equations (4)-(9) may enable the thyristor detection system 32 to compute the line frequency ripple component using shift and addition operations instead of multiplication operations. This, in turn, may decrease the computation time, the computing power, the resource consumption (e.g., the amount of data stored during calculations) for calculating the ripple component.

Once the thyristor detection system 32 calculates the ripple component, the thyristor detection system 32 determines whether the line frequency ripple component is significant for multiple cycles. By evaluating the line frequency ripple component over multiple cycles, the thyristor detection system 32 may avoid false positives due to transient signals within the frequency range due to a temporary voltage imbalance at startup. If the line frequency ripple component is significant for multiple cycles, the thyristor detection system 32 determines that at least one SCR 36 is non-operating. The thyristor detection system 32 may then initiate a shut down process for the welding system 10, either alone or in conjunction with the control circuitry 18. For example, in some embodiments, the thyristor detection system 32 may activate a control signal to initiate the shut down process, while in other embodiments, the thyristor detection system 32 may communicate with the control circuitry 18, which will then activate the control signal. In such embodiments, the control circuitry 18 may provide feedback to the operator via the operator interface 20 prior to the shut down process. Alternately, the thyristor detection system 32 or the control circuitry 18 may provide feedback to the operator indicating that at least one SCR 36 is non-operating, and then the operator may initiate the shut down process. In such embodiments, the control circuitry 18 may allot a window of time for the operator to initiate the shut down process before initiating the shut down process itself.

In some embodiments, the thyristor detection system 32 may generate a warning for a non-operating SCR 36. That is, if the failure threshold is a certain number of cycles (e.g., 30 cycles), then the thyristor detection system 32 may establish a warning threshold for a smaller number of cycles. If the line frequency ripple component is significant for a number of cycles greater or equal to the warning threshold but not the failure threshold, then either the thyristor detection system 32 or the control circuitry 18 may use the operator interface 20 to provide a warning to the operator. It should be noted that any scheme can be used for computing the number of cycles used to determine a problem with an SCR. For example, in a currently contemplated embodiment, when the line frequency ripple component is significant a counter is augmented one count. The counter is decremented 3 counts when the line frequency ripple component is negligible, with a zero count being a base. The count may thus accumulate if the behavior continues to appear problematical, and may ultimately reach the threshold for indicating there is a problem. This is, of course, only one example of how the count and detection may be implemented.

Figure 4:
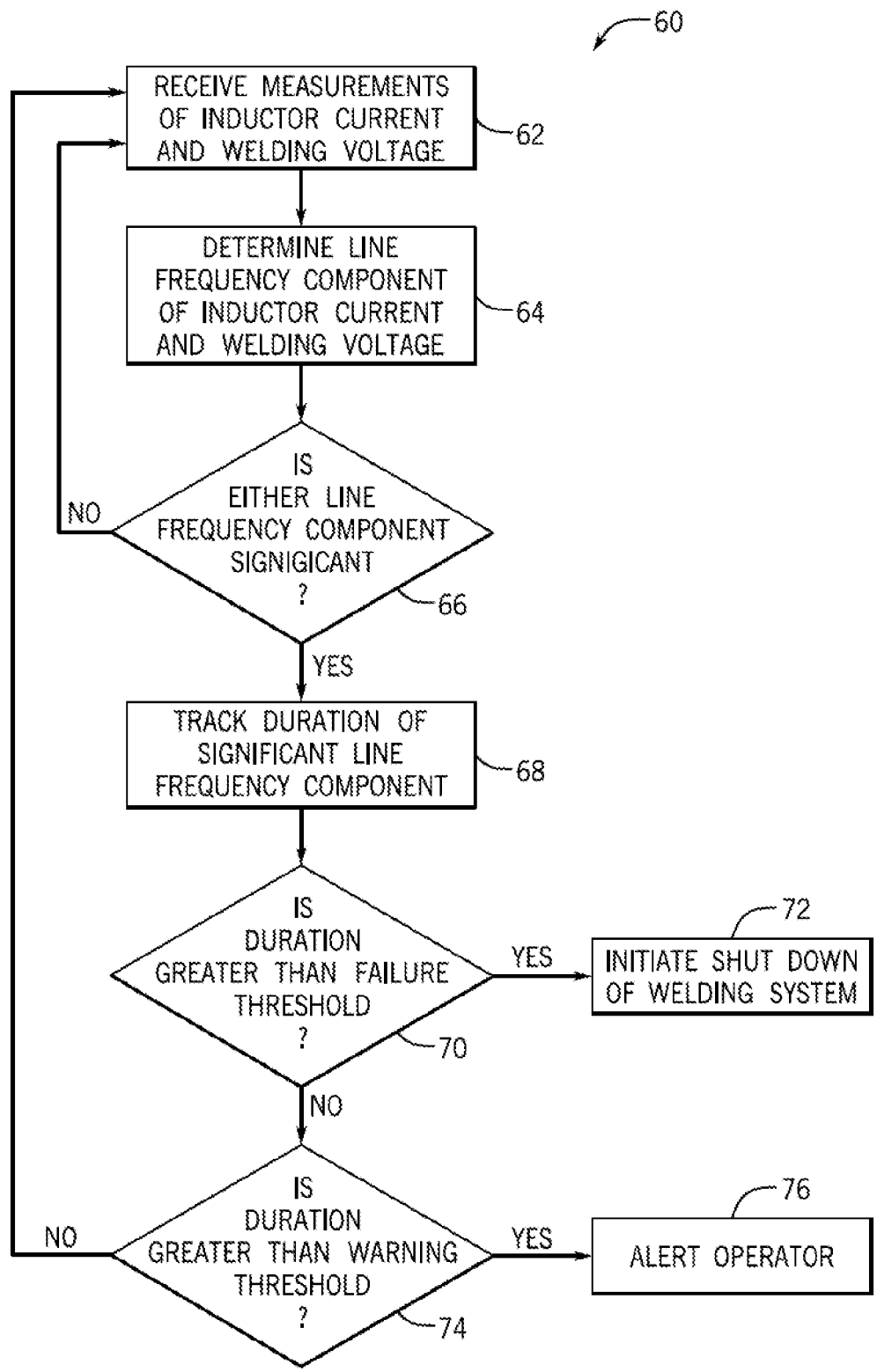
FIG. 4 is a flow chart illustrating a process for operating the thyristor detection system of FIG. 1, in accordance with an embodiment of the present approach.

Turning now to FIG. 4, the thyristor detection system 32 may execute a process 60 to detect non-operating SCRs 36. Although the process 60 is described below in detail, the process 60 may include other steps not shown in FIG. 4. Additionally, the steps illustrated may be performed concurrently or in a different order. The process 60 may be stored in the memory 52 and executed by the processor 50, as described above, in embodiments in which the thyristor detection system 32 consists of digital control logic.

Beginning at block 62, the thyristor detection system 32 may receive measurements of the inductor current and welding voltage signals. As these signals are frequently measured for other control purposes, the thyristor detection system 32 may receive the measurements from the control circuitry 18. In other embodiments, the thyristor detection system 32 may be configured to receive the measurements from current and voltage sensors disposed within the welding system 10.

At block 64, the thyristor detection system 32 determines the line frequency ripple component of the inductor current and welding voltage signals. The thyristor detection system 32 may use the equations (4)-(9) outlined above. Further, as described above, the thyristor detection system 32 evaluates the line frequency ripple component of both the inductor current and the welding voltage signals to detect both shorted and open SCRs 36.

After determining the line frequency ripple component, the thyristor detection system 32 determines whether the line frequency ripple component is significant at block 66. If the line frequency ripple component is negligible, then the thyristor detection system 32 returns to receiving measurements of the inductor current and welding voltage at block 62. As will be appreciated by those skilled in the art, if the SCR's are operating normally, a ripple frequency of 360 Hz (or 180 Hz if unbalanced) would be expected for systems receiving a 60 Hz input power signal. That is, the line frequency component of such a system would be negligible. The detection of a significant line frequency ripple component then, represents malfunction of an SCR. It should also be noted that the techniques disclosed here may be used to detect that the system is "single phasing".

If the thyristor detection system 32 determines that the line frequency ripple component is significant, then the thyristor detection system 32 tracks the number of cycles in which the component is significant at block 68. At block 70, the thyristor detection system 32 then determines if the duration is larger than the failure threshold. If so, then the thyristor detection system 32 initiates a shut down process for the welding system 10 at block 72.

If the thyristor detection system 32 determines that the duration is less than the failure threshold, that at block 74, the thyristor detection system 32 determines whether the duration is greater than the warning threshold. If so, then the thyristor detection system 32 sends an alert to the operator at block 76. If not, then the thyristor detection system 32 returns to receiving measurements of the inductor current and the welding voltage at block 62.

Figure 5:
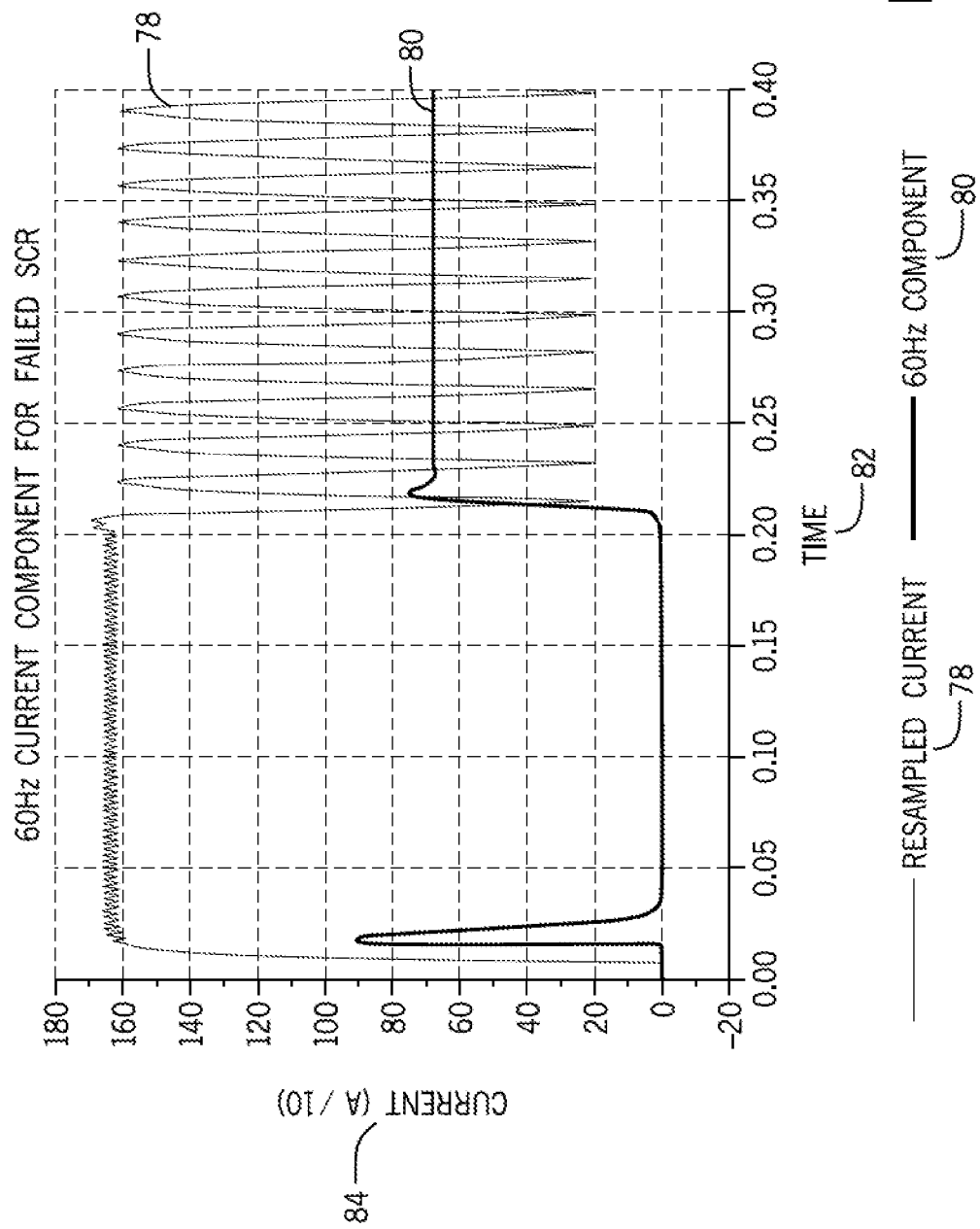
FIG. 5 is a graph illustrating simulation results for detecting a shorted thyristor, in accordance with an embodiment of the present approach.
Figure 6:
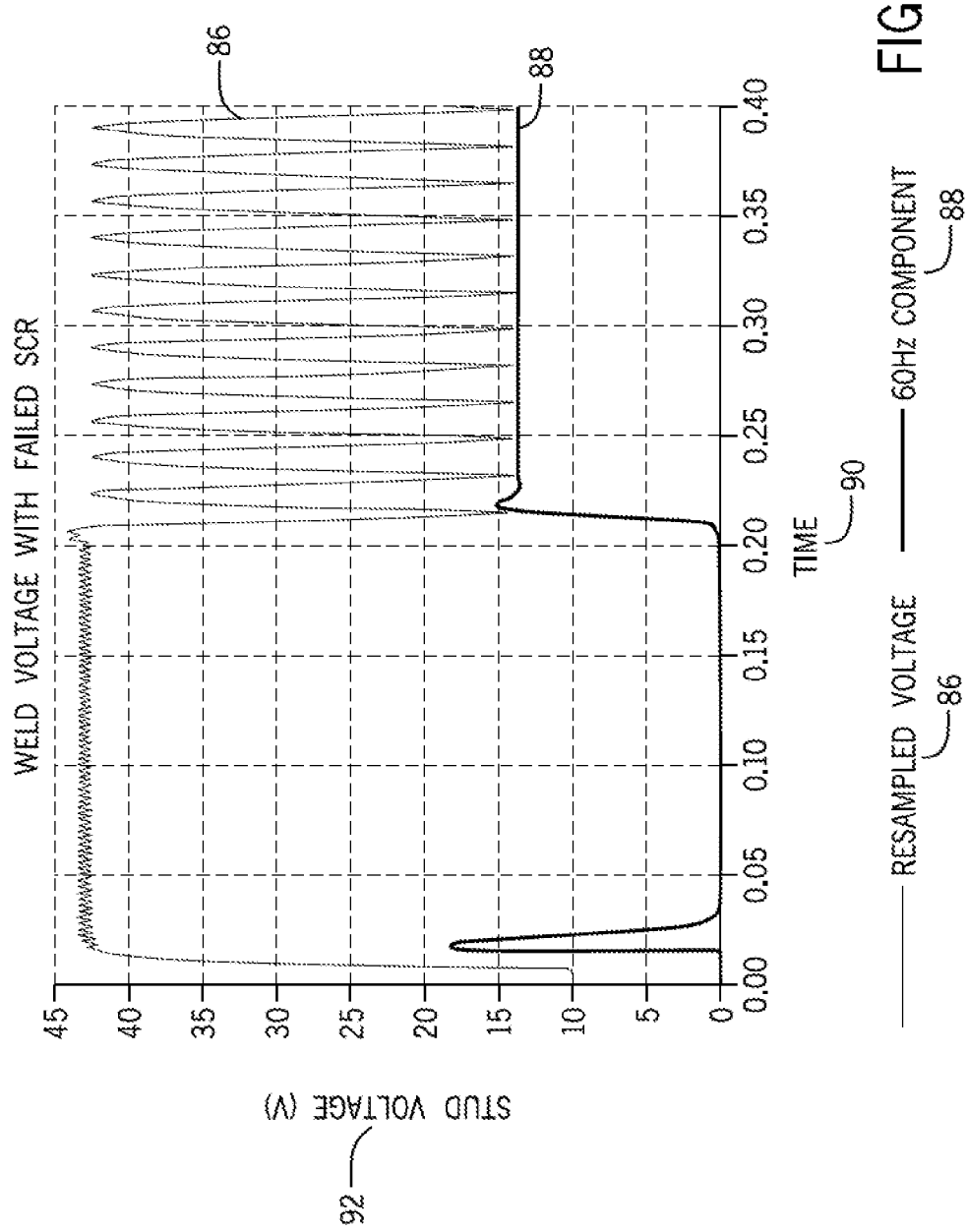
FIG. 6 is a graph illustrating simulation results for detecting an open thyristor, in accordance with an embodiment of the present approach.
Figure 7:
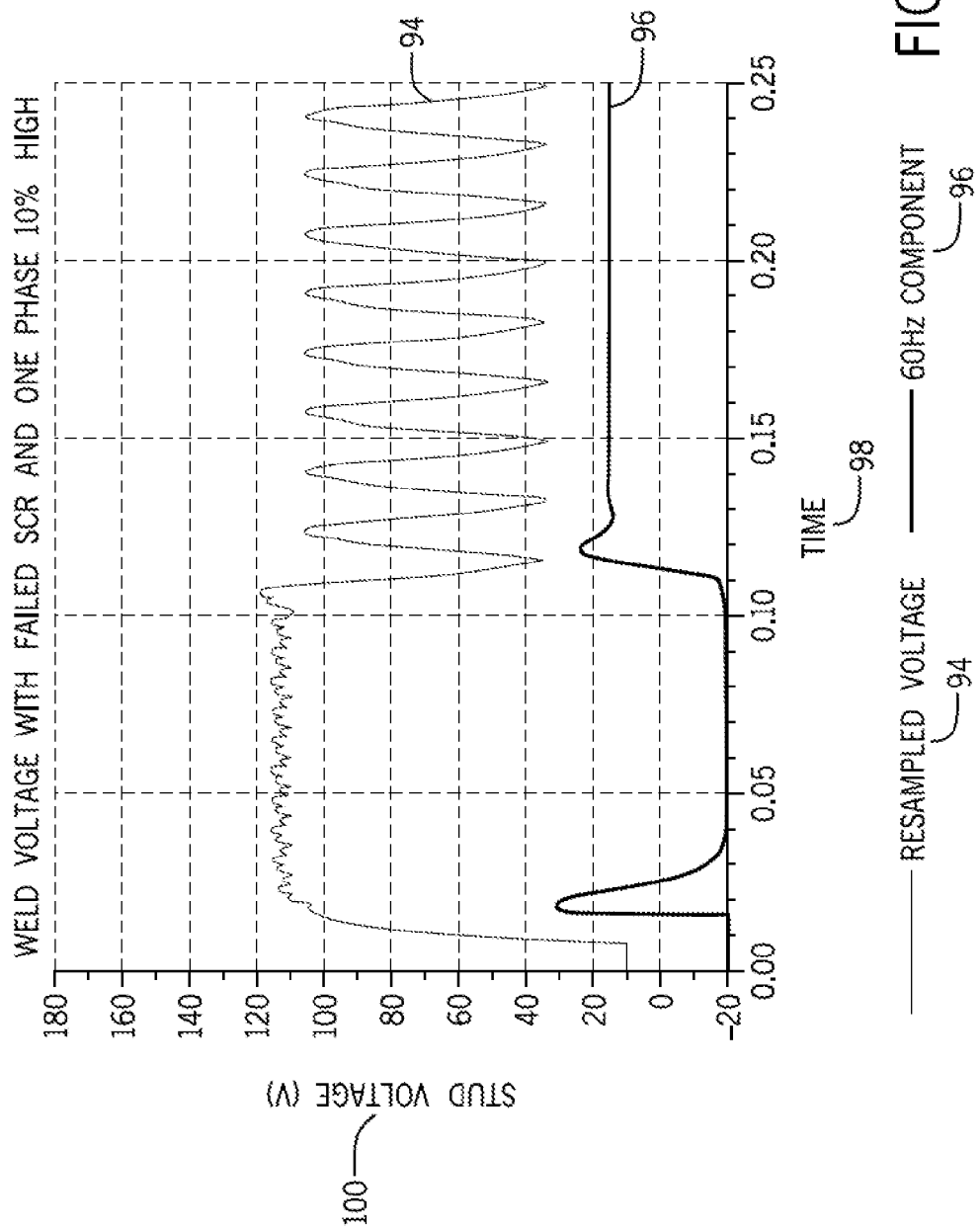
FIG. 7 is a graph illustrating simulation results for detection a non-operating thyristor, in accordance with an embodiment of the present approach.

FIGS. 5, 6, and 7 depict simulations of the thyristor detection system 32. In particular, FIG. 5 depicts the detection of a shorted SCR 36 in a welding system 10 that utilizes an AC power signal with a frequency of 60 Hz. That is, FIG. 5 depicts the determination that the 60 Hz (line frequency) component of ripple of the inductor current is significant. FIG. 5 includes an abscissa 82 having a time and an ordinate 84 having a current, which is reduced by a power of ten for the purposes of FIG. 5. FIG. 5 also includes the resampled value 78 of the inductor current, and a digital signal 80 indicating the presence of the 60 Hz component of the ripple component. As depicted, the thyristor detection system 32 detects the presence of a non-operating SCR 36 within 3 cycles, or 0.05 seconds on a 60 Hz system.

Similarly, FIG. 6 depicts the detection of an open SCR 36 in a welding system 10 that utilizes an AC power signal with a frequency of 60 Hz. That is, FIG. 6 depicts the determination that the 60 Hz ripple component of the welding voltage is significant. FIG. 6 includes an abscissa 90 having a time and an ordinate 92 having a stud voltage. FIG. 6 also includes the resampled value 86 of the welding voltage, and a digital signal 88 indicating the presence of the 60 Hz component of the ripple. Similarly to the depiction of FIG. 5, the thyristor detection system 32 detects the presence of a non-operating SCR 36 within 0.05 seconds.

FIG. 7 depicts the detection of a non-operating SCR 36 in a welding system 10 that employs an unbalanced power source 14, in which the sum of the voltages for each phase of the AC power signal is non-zero. The simulated welding system 10 utilizes an AC power signal with a frequency of 60 Hz. FIG. 7 includes an abscissa 98 having a time and an ordinate 100 having a stud voltage. FIG. 7 also includes the resampled value 94 of the welding voltage, and a digital signal 96 indicating the presence of the 60 Hz component of the ripple component. As can be seen in the simulation results, the thyristor detection system 32 detects the presence of a non-operating SCR 36 within 0.05 seconds. In general, the thyristor detection system 32 can detect a non-operating SCR 36 in as little as 50 ms, thereby reducing the risk of issues due to a non-operating SCR 36.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A welding system, comprising:
   a power supply coupled to a power source and configured to receive a power signal, the power supply comprising power conversion circuitry having one or more silicon-controlled rectifiers (SCRs) and configured to rectify the power signal to generate a DC signal for use in providing welding power; and
   an SCR detection system configured to receive a first signal from the power conversion circuitry, wherein the first signal is indicative of an inductor current of the DC signal, to receive a second signal from the power conversion circuitry, wherein the second signal is indicative of a voltage of the DC signal, and to detect a non-firing, open, or shorted SCR in the one or more SCRs based on the inductor current or the voltage of the DC signal, or both.

2. The welding system of claim 1, wherein the SCR detection system is configured to determine a ripple component of the inductor current and the voltage, and detect the non-firing, open, or shorted SCR if the ripple component is significant at a frequency of the power signal for a pre-set number of cycles.

3. The welding system of claim 2, wherein the SCR detection system is configured to detect the frequency of the power signal.

4. The welding system of claim 1, wherein the SCR detection system comprises memory and a digital signal processor.

5. The welding system of claim 1, wherein the SCR detection system is part of a retrofit kit for the welding system.

6. The welding system of claim 2, wherein the SCR detection system is configured to determine the ripple component using only shift and add operations.

7. The welding system of claim 1, wherein the SCR detection system is configured to shut down the welding system upon detection of a non-firing, open, or shorted SCR.

8. The welding system of claim 1, wherein the SCR detection system is configured to generate an operator alert upon detection of a non-firing, open, or shorted SCR.

9. The welding system of claim 1, wherein the power supply is configured to rectify single-phase power from a single-phase power source.

10. The welding system of claim 1, wherein the power supply is configured to rectify three-phase power from the power source.

11. The welding system of claim 1, wherein the power signal is a balanced power signal.

12. The welding system of claim 1, wherein the power signal is an unbalanced power signal.

13. A method, comprising, in a welding system comprising a power supply coupled to a power source and configured to receive a power signal, the power supply comprising power conversion circuitry having one or more silicon-controlled rectifiers (SCRs) and configured to rectify the power signal to generate a DC signal for use in providing welding power:
   receiving a first signal from the power conversion circuitry via an SCR detection system, wherein the first signal is indicative of a frequency of an AC signal provided by the power source;
   receiving a second signal from the power conversion circuitry via the SCR detection system, wherein the second signal is indicative of an inductor current of a DC signal generated by rectifying the AC signal via the power conversion circuitry;
   receiving a third signal from the power conversion circuitry via the SCR detection system, wherein the third signal is indicative of a voltage of the DC signal;
   determining, via the SCR detection system, a ripple component of the inductor current or a voltage, or both, based at least in part on the first, second, and third signals;
   detecting, via the SCR detection system, a non-firing, open, or shorted SCR if the ripple component is significant for a pre-set number of cycles of the AC signal.

14. The method of claim 13, comprising using a Fourier transform to determine the ripple component.

15. The method of claim 13, comprising generating a warning signal if the ripple component is equivalent to the frequency of the AC signal for a pre-set number of cycles less than a number of cycles that indicates a non-firing, open, or shorted SCR.

16. The method of claim 13, comprising generating and transmitting a control signal to a control system of a welding system comprising the power conversion circuitry upon detecting a non-firing, open, or shorted SCR.

17. A retrofit kit for a welding system, comprising:
   electronic memory storing executable code; and
   a digital signal processor operatively coupled to the electronic memory and configured to execute the executable code to receive a signal indicative of an AC power signal for a welding system, a signal indicative of an inductor current of a DC signal generated by rectifying the AC power signal, and a signal indicative of a welding voltage of the DC signal, to determine a line frequency ripple component of the inductor current or the welding voltage, or both, and to detect a non-firing, open, or shorted SCR if the line frequency ripple component is significant.

18. The retrofit kit of claim 17, wherein the digital signal processor is configured to generate a warning signal if the line frequency ripple component is significant for a pre-set number of cycles less than a number of cycles that indicates a non-firing, open, or shorted SCR.

19. The retrofit kit of claim 18, wherein the digital signal processor is configured to detect a frequency of the AC power signal.

20. The retrofit kit of claim 17, wherein the digital signal processor is configured to transmit a control signal to a control system for the welding system upon detection of a non-firing, open, or shorted SCR.

* * * * *